(12) United States Patent
Paul et al.

(10) Patent No.: US 10,418,449 B2
(45) Date of Patent: Sep. 17, 2019

(54) CIRCUITS BASED ON COMPLEMENTARY FIELD-EFFECT TRANSISTORS

(71) Applicant: GLOBALFOUNDRIES Inc., Grand Cayman (KY)

(72) Inventors: Bipul C. Paul, Mechanicville, NY (US); Ruilong Xie, Niskayuna, NY (US); Puneet Harischandra Suvarna, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/866,855

(22) Filed: Jan. 10, 2018

(65) Prior Publication Data
US 2019/0214469 A1    Jul. 11, 2019

(51) Int. Cl.
| H01L 21/70 | (2006.01) |
| H01L 29/417 | (2006.01) |
| H01L 29/06 | (2006.01) |
| H01L 27/092 | (2006.01) |
| H01L 21/8238 | (2006.01) |
| H01L 23/48 | (2006.01) |

(52) U.S. Cl.
CPC .......... *H01L 29/41733* (2013.01); *H01L 21/823821* (2013.01); *H01L 21/823871* (2013.01); *H01L 21/823878* (2013.01); *H01L 23/481* (2013.01); *H01L 27/0924* (2013.01); *H01L 29/0653* (2013.01); *H01L 29/0665* (2013.01)

(58) Field of Classification Search
CPC ......... H01L 21/823878; H01L 27/0924; H01L 29/165; H01L 29/66553; H01L 29/0669; H01L 21/823814; H01L 21/823821; H01L 29/66545
See application file for complete search history.

(56) References Cited

U.S. PATENT DOCUMENTS

| 10,269,983 B2* | 4/2019 | Frougier | H01L 29/78696 |
| 10,283,516 B1* | 5/2019 | Reznicek | G11C 16/0458 |
| 2013/0049818 A1* | 2/2013 | Liu | H03K 17/74 |
| | | | 327/109 |
| 2014/0151638 A1* | 6/2014 | Chang | H01L 29/42392 |
| | | | 257/27 |
| 2014/0151639 A1* | 6/2014 | Chang | H01L 29/42392 |
| | | | 257/27 |
| 2016/0027929 A1* | 1/2016 | Cheng | H01L 29/78696 |
| | | | 257/9 |
| 2016/0211264 A1* | 7/2016 | Peng | H01L 21/8221 |
| 2017/0040321 A1* | 2/2017 | Mitard | H01L 29/78684 |
| 2017/0053998 A1* | 2/2017 | Kim | H01L 29/42392 |

(Continued)

*Primary Examiner* — Ismail A Muse
(74) *Attorney, Agent, or Firm* — Thompson Hine LLP; Anthony Canale

(57) ABSTRACT

Structures and circuits including multiple nanosheet field-effect transistors and methods of forming such structures and circuits. A complementary field-effect transistor includes a first nanosheet transistor with a source/drain region and a second nanosheet transistor with a source/drain region stacked over the source/drain region of the first nanosheet transistor. A contact extends vertically to connect the source/drain region of the first nanosheet transistor of the complementary field-effect transistor and the source/drain region of the second nanosheet transistor of the complementary field-effect transistor.

20 Claims, 20 Drawing Sheets

(56) References Cited

U.S. PATENT DOCUMENTS

2017/0250250 A1* 8/2017 Bentley .............. H01L 29/0673
2017/0271477 A1* 9/2017 Palle ................. H01L 29/66553
2017/0271514 A1* 9/2017 Kittl .................... H01L 29/7848
2018/0175167 A1* 6/2018 Reboh ............... H01L 29/78696

* cited by examiner

CIRCUITS BASED ON COMPLEMENTARY FIELD-EFFECT TRANSISTORS

BACKGROUND

The present invention relates to semiconductor device fabrication and integrated circuits and, more specifically, to structures and circuits including multiple nanosheet field-effect transistors and methods of forming such structures and circuits.

Device structures for a field-effect transistor generally include a source, a drain, and a gate electrode configured to switch carrier flow in a channel formed in a semiconductor body between the source and drain. When a control voltage exceeding a designated threshold voltage is applied to the gate electrode, the flow of carriers in the channel between the source and drain produces a device output current.

The body and channel of a planar field-effect transistor are arranged beneath the top surface of a substrate on which the gate electrode is supported. A fin-type field-effect transistor (FinFET) is a non-planar device structure for a field-effect transistor that may be more densely packed in an integrated circuit than planar field-effect transistors. A FinFET includes a fin, heavily-doped source/drain regions, and a gate electrode that wraps around the fin. During operation, a channel for carrier flow is formed in the fin between the source/drain regions. In comparison with planar field-effect transistors, the arrangement between the gate structure and fin improves control over the channel and reduces the leakage current when the FinFET is in its 'Off' state. This, in turn, lowers threshold voltages in comparison with planar field-effect transistors, and results in improved performance and lowered power consumption.

Nanosheet field-effect transistors have been developed as an advanced type of FinFET that may permit additional increases in packing density in an integrated circuit. The body of a nanosheet field-effect transistor includes multiple nanosheet channel layers vertically stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched and removed in order to release the nanosheet channel layers, and to provide spaces for the formation of the gate stack.

SUMMARY

In embodiments of the invention, a structure includes a complementary field-effect transistor with a first nanosheet transistor with a source/drain region and a second nanosheet transistor with a source/drain region stacked over the source/drain region of the first nanosheet transistor. A contact extends vertically to connect the source/drain region of the first nanosheet transistor of the complementary field-effect transistor and the source/drain region of the second nanosheet transistor of the complementary field-effect transistor.

In embodiments of the invention, a structure includes a first complementary field-effect transistor with a first nanosheet transistor with a source/drain region, and a second nanosheet transistor having a source/drain region stacked over the source/drain region of the first nanosheet transistor. The structure further includes a second complementary field-effect transistor with a nanosheet transistor with a functional gate structure that is coupled with the source/drain region of the first nanosheet transistor of the first complementary field-effect transistor.

In embodiments of the invention, a method includes forming a first complementary field-effect transistor with a first nanosheet transistor with a source/drain region and a second nanosheet transistor having a source/drain region stacked over the source/drain region of the first nanosheet transistor. The method further includes forming a contact extending vertically to connect the source/drain region of the first nanosheet transistor of the first complementary field-effect transistor and the source/drain region of the second nanosheet transistor of the first complementary field-effect transistor.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIG. 2B is a top view of the device structure of FIGS. 2, 2A in which FIG. 2 is taken generally along line 2-2 and FIG. 2A is taken generally along line 2A-2A, and in which only the sacrificial gate structures and body features are shown for clarity of description.

FIGS. 3A-8A are cross-sectional views of the device structure of FIG. 2A at successive fabrication stages.

FIG. 8B is a top view of the device structure of FIGS. 8, 8A in which FIG. 8 is taken generally along line 8-8 and FIG. 8A is taken generally along line 8A-8A, and in which only the sacrificial gate structures, body features, and source/drain regions are shown for clarity of description.

FIGS. 10A-12A are cross-sectional views of the device structure of FIG. 9A at successive fabrication stages.

FIGS. 10B-12B are cross-sectional views of the device structure of FIG. 9B at successive fabrication stages.

FIGS. 10C-12C are cross-sectional views of the device structure of FIG. 9C at successive fabrication stages.

DETAILED DESCRIPTION

Figure 1:
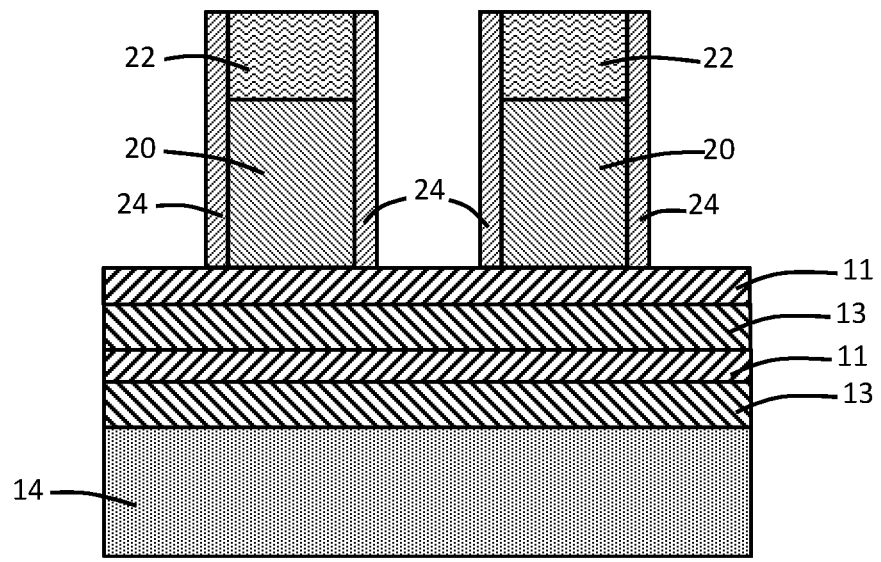
FIG. 1 is a cross-sectional view of a device structure at an initial fabrication stage of a processing method in accordance with embodiments of the invention.

With reference to FIG. 1 and in accordance with embodiments of the invention, semiconductor layers 11 and semiconductor layers 13 are formed in a layer stack on a substrate 14. The substrate 14 is composed of a semiconductor material, such as single crystal silicon. The semiconductor layers 11, 13 may be sequentially formed by an epitaxial growth process with the composition alternated during growth through a selection of the reactants. The number of semiconductor layers 11 and semiconductor layers 13 may differ from the number in the depicted representative embodiment and, in particular, may be greater than the number in the representative embodiment and may be added in additional pairs of layers 11 and 13.

The semiconductor layers 11 are composed of a semiconductor material, and the semiconductor layers 13 are composed of a different semiconductor material that is selected to be selectively removed to the semiconductor material of the semiconductor layers 11. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layers 11 may be composed of silicon (Si), and the semiconductor layers 13 may be composed of silicon germanium (SiGe) with a germanium content of twenty percent (20%) to sixty percent (60%) that etches at a higher rate than silicon.

Sacrificial gate structures 20 are formed with a given pitch on the top surface of the topmost semiconductor layer 11 of the layer stack. The sacrificial gate structures 20 may be composed of a semiconductor material, such as amorphous silicon, that is deposited by CVD and patterned with reactive ion etching (RIE) using a hardmask. The sacrificial gate structures 20 are arranged between adjacent sacrificial gate structures (not shown) on the top surface of the topmost semiconductor layer 11 of the layer stack.

Each of the sacrificial gate structures 20 is covered by a dielectric cap 22 located on its top surface. The dielectric caps 22 may be composed of, for example, silicon nitride ($Si_3N_4$). Dielectric spacers 24 are formed on the top surface of the topmost semiconductor layer 11 of the layer stack and are positioned adjacent to the vertical sidewalls of each sacrificial gate structure 20 and its dielectric cap 22. The dielectric spacers 24 may be composed of a low-k dielectric material, such as SiBCN or SiOCN.

Figure 2:
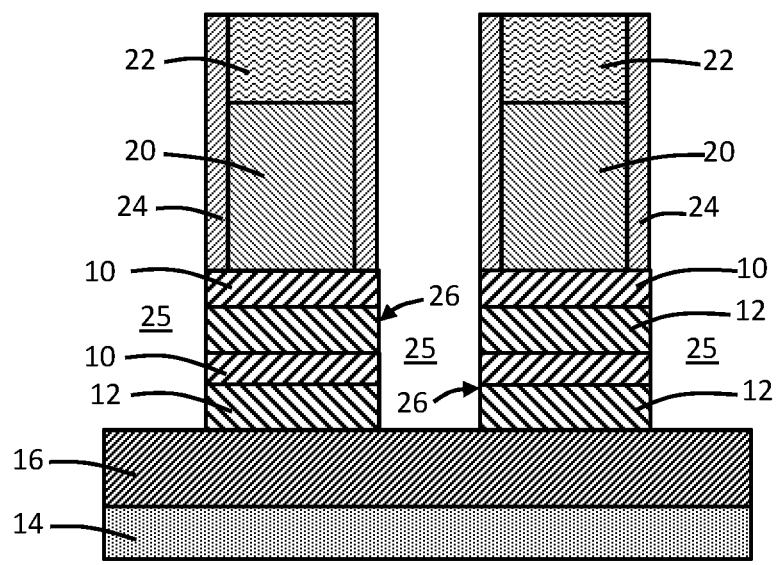
FIG. 2 is a cross-sectional view of the device structure of FIG. 1 at a subsequent fabrication stage of the processing method.
Figure 2A:
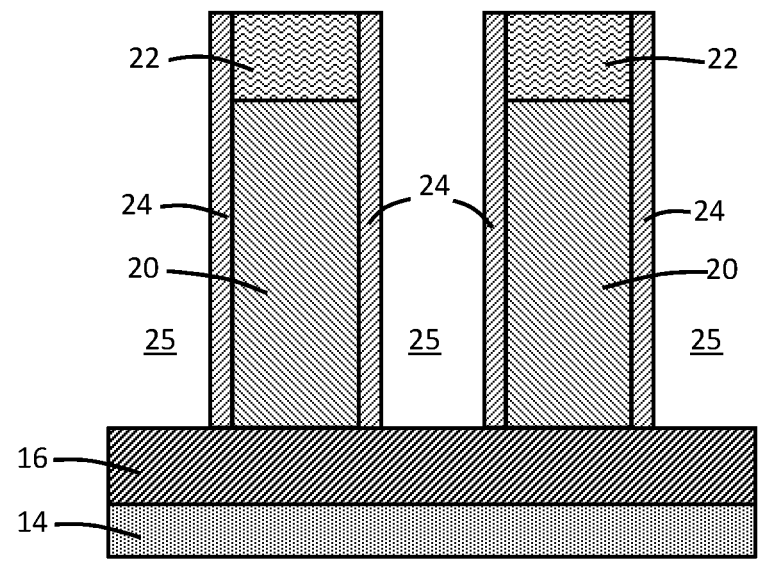
FIG. 2A is a cross-sectional view of the device structure taken generally along line 2A-2A in FIG. 2B.
Figure 2B:
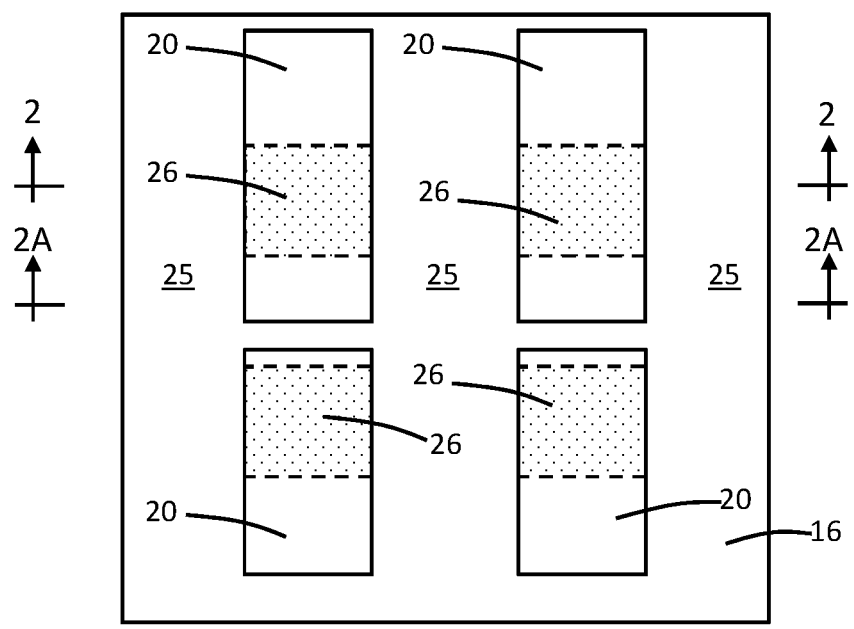

With reference to FIGS. 2, 2A, 2B in which like reference numerals refer to like features in FIG. 1 and at a subsequent fabrication stage of the processing method, fins or body features 26 are formed from the semiconductor layers 11, 13 of the layer stack by an etching process that relies on the sacrificial gate structure 20 and associated dielectric spacers 24 as an etch mask. The self-aligned etching process, which may be a reactive ion etching (RIE) process, relies on one or more etch chemistries to etch trenches that extend through the semiconductor layers 11, 13. In the representative embodiment, the body features 26 are laterally arranged between adjacent body features (not shown), which are formed by the self-aligned etching process beneath the additional sacrificial gate structures (not shown) flanking the sacrificial gate structures 20, such that additional spaces 25 are located at the periphery of the body features 26.

Each of the body features 26 includes nanosheet channel layers 10 patterned from the semiconductor layers 11 and sacrificial layers 12 patterned from the semiconductor layers 13. The layers 10, 12 inherit the respective thicknesses of the layers 11, 13. The nanosheet channel layers 10 are arranged to alternate with the sacrificial layers 12 in a vertical direction, and the layers 10, 12 are aligned along the sidewalls of each of the body feature 26. Adjacent body features 26 are separated by spaces 25. In a representative embodiment, the structure may include a set of four body features 26 that are generally arranged at the corners of a rectangle as best shown in FIG. 2B.

A dielectric layer 16 may be formed that electrically isolates the semiconductor layers 10, 12 from the substrate 14. For example, the dielectric layer 16 may be formed by etching the trenches into the substrate 14 and etching the substrate 14 laterally beneath the layers 10, 12, and then filling with a dielectric material, such as silicon dioxide ($SiO_2$). The dielectric layer 16 electrically isolates the body features 26 from the substrate 14.

Figure 3:
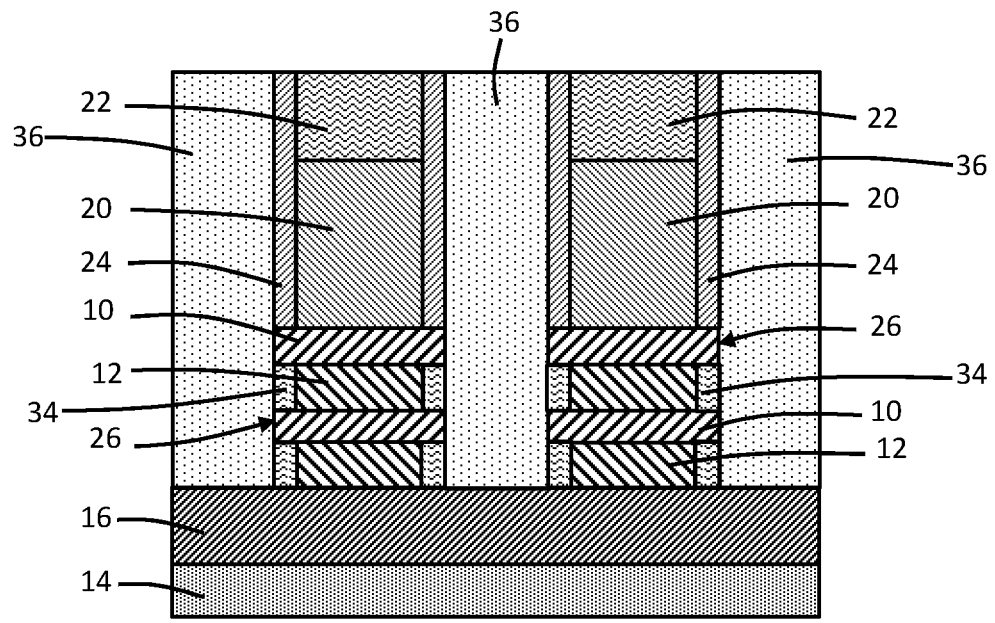
FIGS. 3-8 are cross-sectional views of the device structure of FIG. 2 at successive fabrication stages.
Figure 3A:
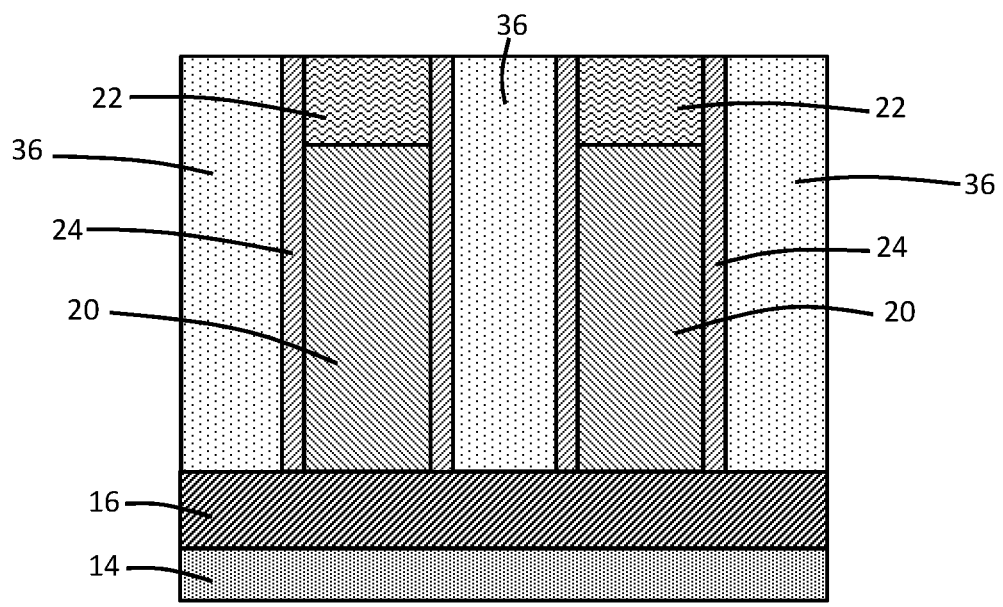

With reference to FIGS. 3, 3A in which like reference numerals refer to like features in FIGS. 2, 2A and at a subsequent fabrication stage of the processing method, the sacrificial layers 12 are laterally recessed relative to the nanosheet channel layers 10 with a dry or wet isotropic etching process that etches the materials constituting the sacrificial layers 12 selective to the material constituting the nanosheet channel layers 10. The lateral recessing of the sacrificial layers 12 generates indents in the sidewalls of each body feature 26 because the nanosheet channel layers 10 are not laterally recessed.

Inner spacers 34 are formed in the indents in the sidewalls of each body feature 26. The inner spacers 34 may be formed by depositing a conformal layer composed of a dielectric material, such as silicon nitride ($Si_3N_4$), by atomic layer deposition (ALD), that fills the indents, and then performing an etching process that removes the conformal layer outside of the indents.

After the inner spacers 34 are formed, an epitaxial semiconductor layer 36 is formed in the spaces 25 between the sidewalls of the body features 26. The epitaxial semiconductor layer 36 may be formed by an epitaxial growth process in which the semiconductor material grows from growth seeds provided by the exposed surfaces of the nanosheet channel layers 10 at the sidewalls of the body features 26 and merges in the space 25 between adjacent body features 26. The epitaxial semiconductor layer 36 is physically isolated from the sacrificial layers 12 by the inner spacers 34, which also prevent unwanted epitaxial growth from the sacrificial layers 12. The epitaxial semiconductor layer 36 may be grown to overfill the spaces between the sidewalls of the body features 26, and then planarized by chemical mechanical polishing (CMP) to be coplanar with the dielectric caps 22. Alternatively, the epitaxial growth of the epitaxial semiconductor layer 36 may be terminated before the spaces are occluded, and the remainder of the spaces may be filled by depositing heavily-doped silicon-germanium (SiGe) or a metal like tungsten (W).

The semiconductor material constituting the epitaxial semiconductor layer 36 may be heavily doped to have either p-type electrical conductivity or n-type electrical conductivity. In an embodiment, the epitaxial semiconductor layer 36 may be doped during epitaxial growth with an n-type dopant from Group V of the Periodic Table (e.g., phosphorus (P) and/or arsenic (As)) that provides n-type electrical conductivity. In an alternative embodiment, the epitaxial semiconductor layer 36 may be doped during epitaxial growth with a p-type dopant from Group III of the Periodic Table (e.g., boron (B), aluminum (Al), gallium (Ga), and/or indium (In)) that provides p-type electrical conductivity.

Figure 4:
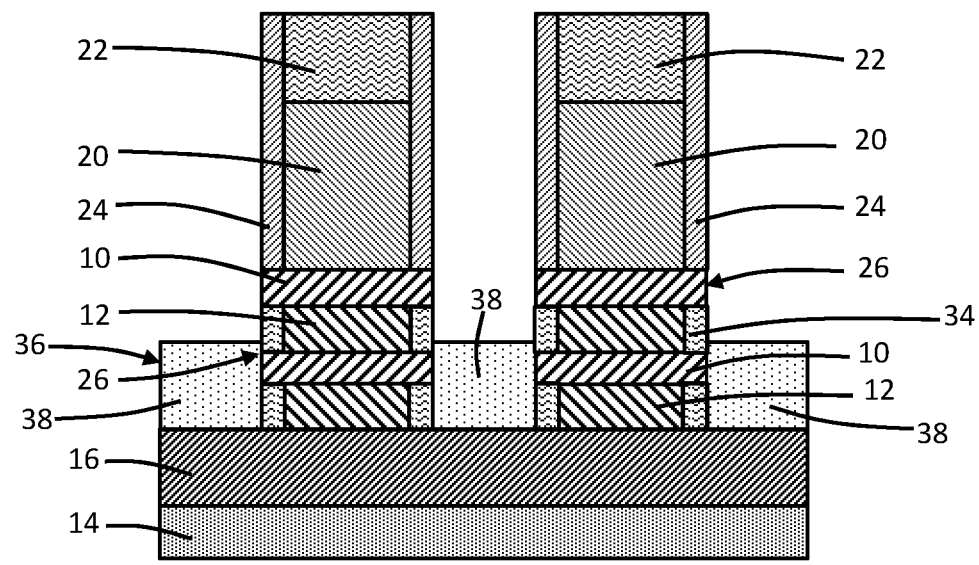
Figure 4A:
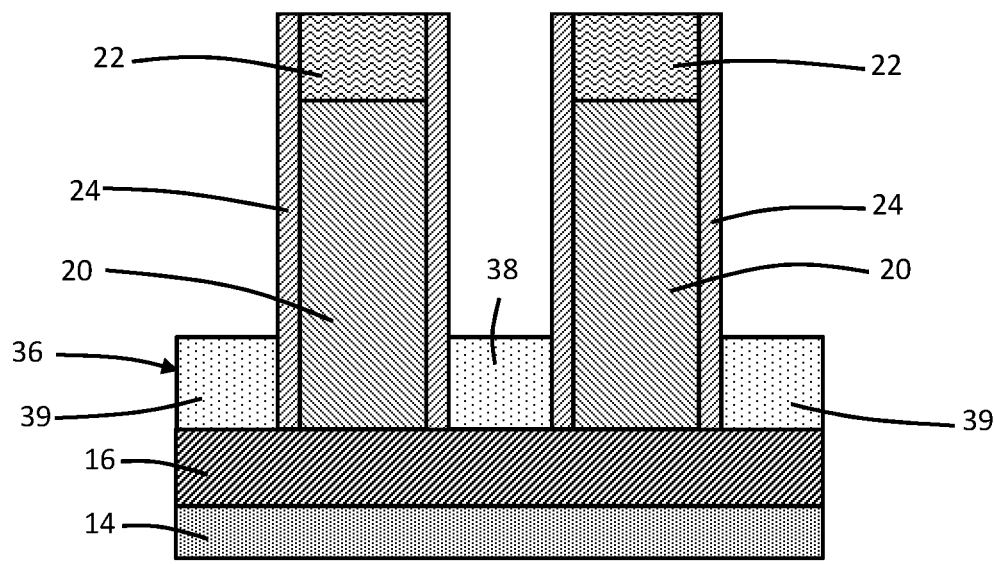

With reference to FIGS. 4, 4A in which like reference numerals refer to like features in FIGS. 3, 3A and at a subsequent fabrication stage of the processing method, the epitaxial semiconductor layer 36 is recessed with an etching process. The remaining sections of the semiconductor layer 36 define source/drain regions 38 that are only coupled with the lower nanosheet channel layers 10. As used herein, the term "source/drain region" means a doped region of semiconductor material that can function as either a source or a drain of a nanosheet field-effect transistor. The source/drain regions 38 are physically isolated from the sacrificial layers 12 by the inner spacers 34. The source/drain regions 38 are electrically isolated from the substrate 14 by the dielectric layer 16. A space is re-opened above each source/drain region 38 such that the upper nanosheet channel layer 10 has exposed surfaces at the sidewalls of the body features 26.

Figure 5:
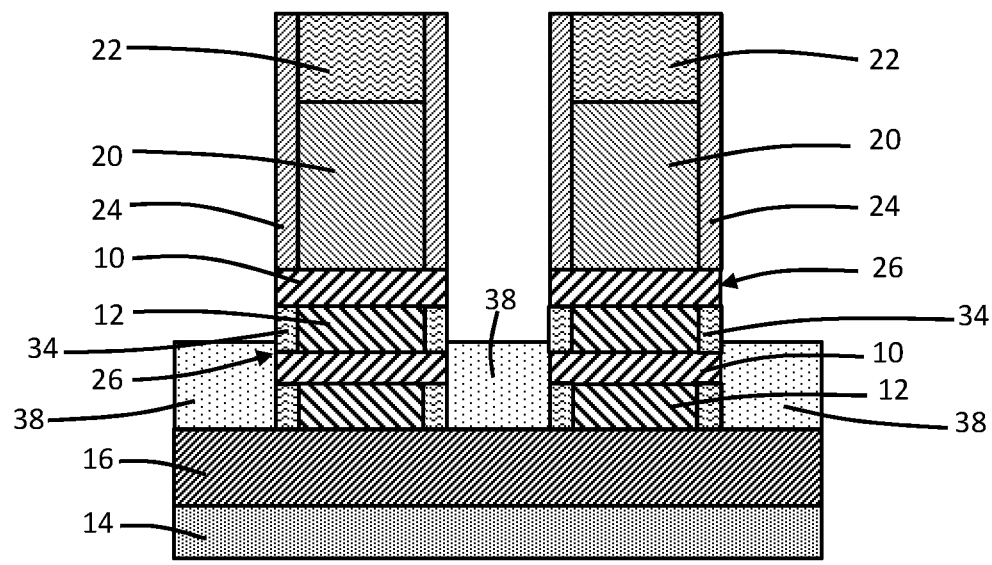
Figure 5A:
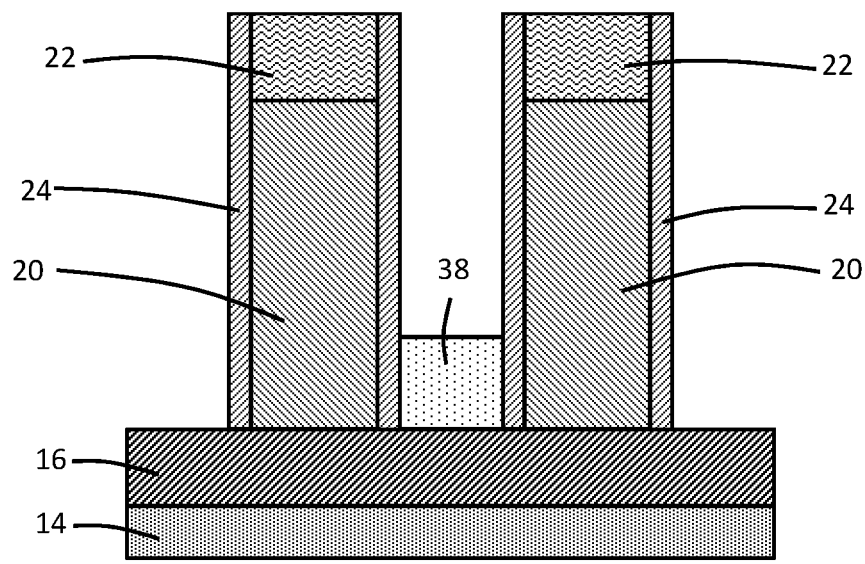

With reference to FIGS. 5, 5A in which like reference numerals refer to like features in FIGS. 4, 4A and at a subsequent fabrication stage of the processing method, the semiconductor layer 36 is patterned to completely remove sections 39 of the semiconductor layer 36 in portions of the spaces 25 between body features 26. The patterning of the semiconductor layer 36 cuts the source/drain regions 38 of the semiconductor layer 36 into sections that are associated with different transistors in the completed structure.

Figure 6:
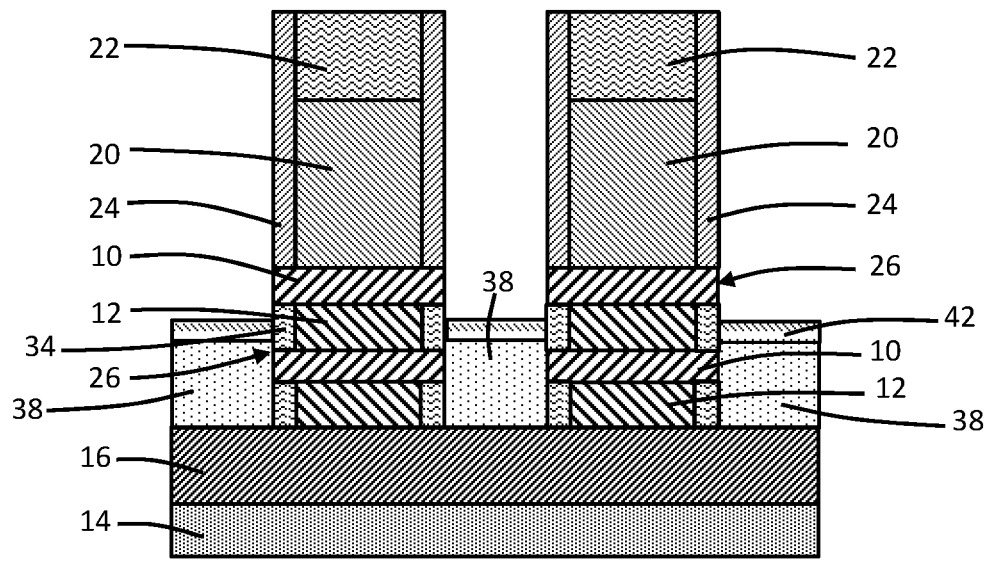
Figure 6A:
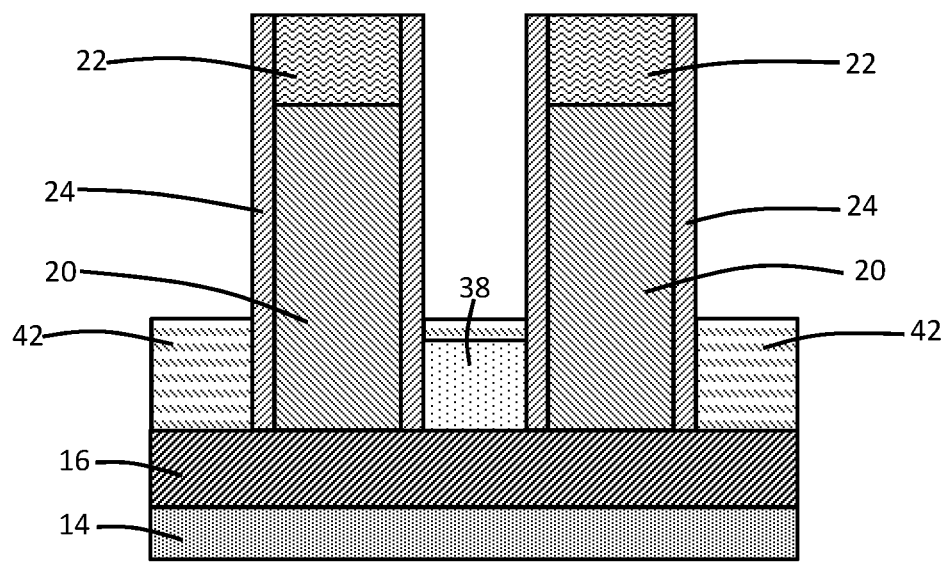

With reference to FIGS. 6, 6A in which like reference numerals refer to like features in FIGS. 5, 5A and at a subsequent fabrication stage of the processing method, dielectric layer 42 composed of a dielectric material, such as silicon dioxide (SiO$_2$), is deposited and recessed with an etching process. The dielectric layer 42 covers the source/drain regions 38, but is recessed to an extent that exposes the surfaces of the upper nanosheet channel layer 10 at the sidewalls of the body features 26. The dielectric layer 42 also fills the portions of the spaces 25 from which the sections 39 of the semiconductor layer 36 were completely removed.

Figure 7:
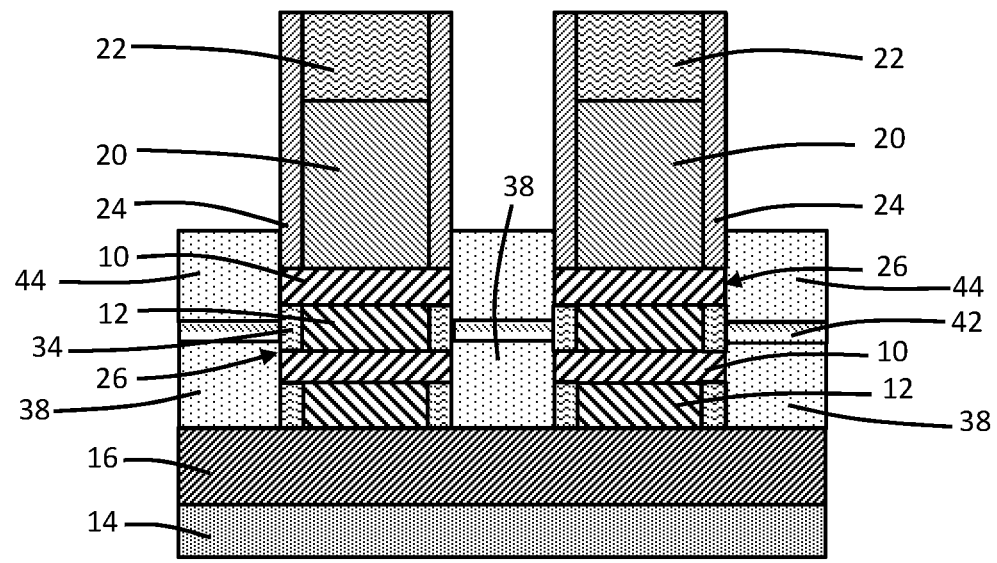
Figure 7A:
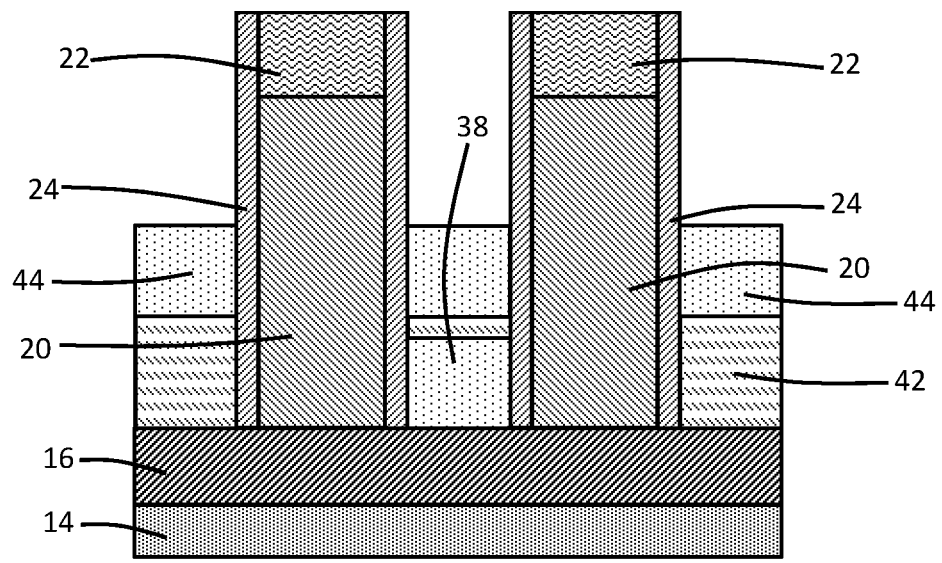

With reference to FIGS. 7, 7A in which like reference numerals refer to like features in FIGS. 6, 6A and at a subsequent fabrication stage of the processing method, an epitaxial semiconductor layer 44 is formed above the dielectric layer 42 in the spaces 25 between the sidewalls of the body features 26, and recessed with an etching process. The epitaxial semiconductor layer 44 may be formed by an epitaxial growth process in which the semiconductor material grows from the growth seed provided by the exposed surfaces of the upper nanosheet channel layers 10 at the sidewalls of the body features 26 and merges in the space between adjacent body features 26. The inner spacers 34 physically isolate the epitaxial semiconductor layer 44 from the sacrificial layers 12, and also prevent unwanted epitaxial growth from the sacrificial layers 12. The epitaxial semiconductor layer 44 may be grown to overfill the spaces 25 between the sidewalls of the body features 26, and then planarized by chemical mechanical polishing (CMP) to be coplanar with the dielectric caps 22 and recessed with an etch back process.

The semiconductor material constituting the epitaxial semiconductor layer 44 may be heavily doped to have an electrical conductivity that is opposite to the electrical conductivity of the source/drain regions 38. In an embodiment in which the source/drain regions 38 have p-type electrical conductivity, the epitaxial semiconductor layer 44 may be doped during epitaxial growth with an n-type dopant from Group V of the Periodic Table (e.g., phosphorus (P) and/or arsenic (As)) that provides n-type electrical conductivity. In an embodiment in which the source/drain regions 38 have n-type electrical conductivity, the epitaxial semiconductor layer 44 may be doped during epitaxial growth with a p-type dopant from Group III of the Periodic Table (e.g., boron (B), aluminum (Al), gallium (Ga), and/or indium (In)) that provides p-type electrical conductivity.

Figure 8:
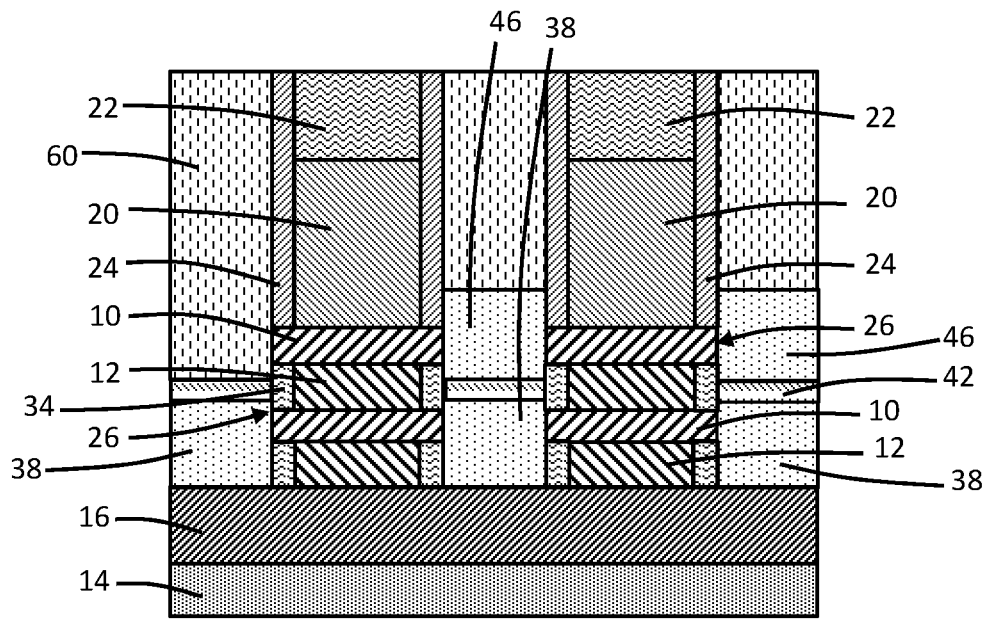
Figure 8A:
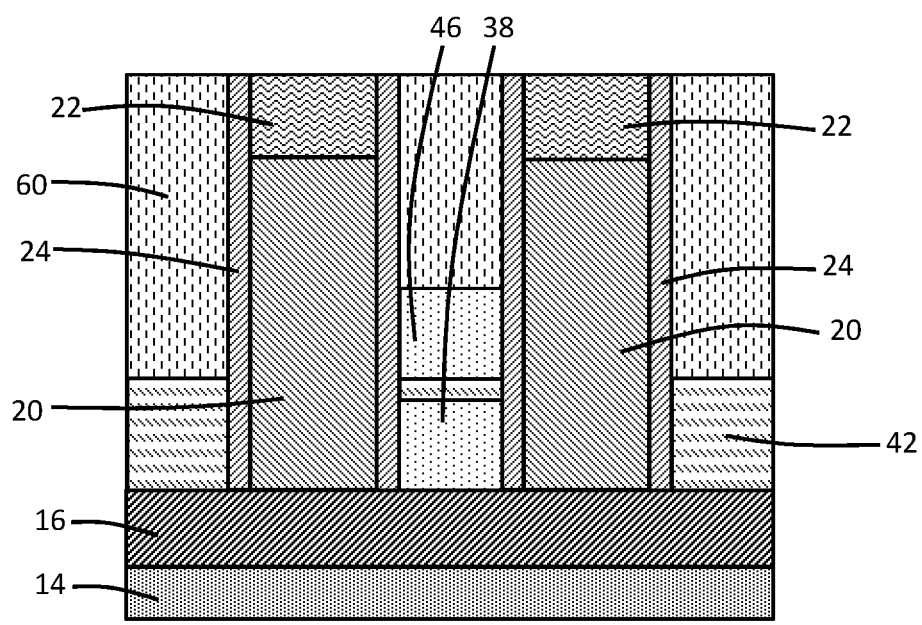
Figure 8B:
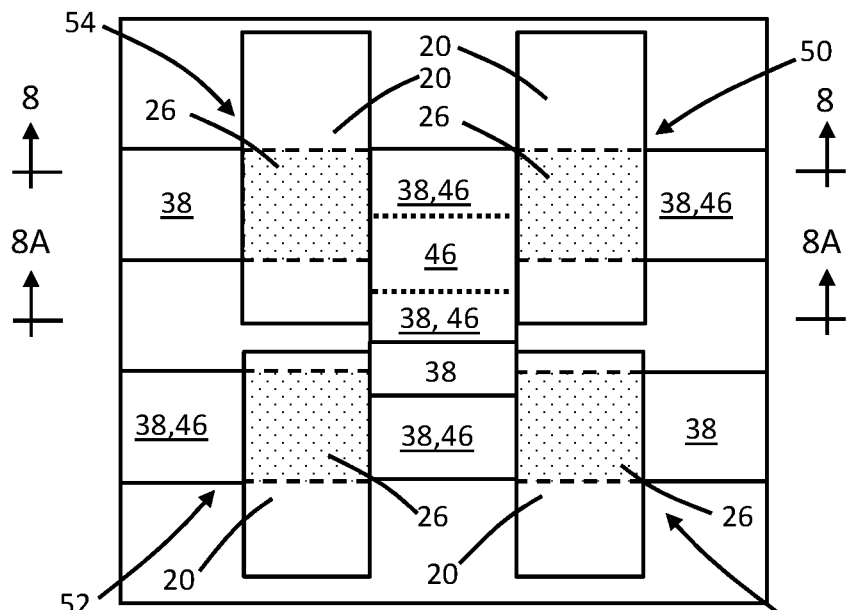

With reference to FIGS. 8, 8A, 8B in which like reference numerals refer to like features in FIGS. 7, 7A and at a subsequent fabrication stage of the processing method, the epitaxial semiconductor layer 44 is patterned to remove sections of the semiconductor layer 44 in a region between body features 26 of different transistors and in regions in which a complementary field-effect transistor is not needed. The remaining sections of the semiconductor layer 44 define source/drain regions 46 that are only coupled with the upper nanosheet channel layer 10. As used herein, the term "source/drain region" means a doped region of semiconductor material that can function as either a source or a drain of a nanosheet field-effect transistor. The source/drain regions 46 are physically isolated from the sacrificial layers 12 by the inner spacers 34. The source/drain regions 46 are electrically isolated from the source/drain regions 38 by the dielectric layer 42.

A dielectric layer 60 is deposited and planarized by chemical-mechanical polishing (CMP). In an embodiment, the dielectric layer 60 may be comprised of an electrical insulator, such as silicon dioxide (SiO$_2$).

As best shown in FIG. 8B, the source/drain regions 38 and 46 are associated with the different body features 26 of a device structure, which may be a six transistor (6-T) static random access memory (SRAM) cell in an embodiment. The source/drain regions 38, which are formed from the semiconductor layer 36, are arranged in a layer that is arranged vertically below a layer that includes source/drain regions 46, which are formed from the semiconductor layer 44.

One of the source/drain regions 46 is stacked with one of the source/drain regions 38 in two instances to define transistor pairs of respective complementary field-effect transistors (CFETs) 50, 52. In each stack, the upper source/drain regions 46 are physically separated from the lower source/drain regions 38 of opposite conductivity-type semiconductor material by a section of the dielectric layer 42 that provides electrical isolation. In an embodiment, the upper source/drain regions 46 of the CFETs 50, 52 may include p-type semiconductor material and may be associated with a p-type nanosheet field-effect transistor, and the lower source/drain regions 38 of the CFETs 50, 52 may include n-type semiconductor material and be associated with an n-type nanosheet field-effect transistor. While illustrated as including only a single nanosheet channel layers 10, each of the CFETS 50 and 52 may instead include multiple nanosheet channel layers 10.

Each of the CFETs 50 and 52 may individually define an inverter and, in particular, each of the CFETs 50 and 52 may constitute cross-coupled inverters of a six transistor (6-T) static random access memory (SRAM) cell. The CFETs 50 and 52 provide four transistors that form two cross-coupled inverters, which provide storage in the 6-T SRAM cell. In an embodiment, the nanosheet field-effect transistors associated with the lower source/drain regions 38 of the CFETs 50, 52 may be pull-down transistors of the 6-T SRAM cell, and the nanosheet field-effect transistors associated with the upper source/drain regions 46 of the CFETs 50, 52 may be pull-up transistors of the 6-T SRAM cell.

In two instances, the source/drain regions 38 are associated with nanosheet field-effect transistors (NSFETs) 54, 56. The patterning of the semiconductor layer 44 removes the sections of the semiconductor layer 44 above the source/drain regions 38 of the NSFETs 54, 56 so that only the source/drain regions 38 for the NSFETs 54, 56 remain. In an embodiment, the source/drain regions 38 of the NSFETs 54, 56 may include n-type semiconductor material and be associated with an n-type nanosheet field-effect transistor. In an embodiment, the NSFETs 54, 56 may constitute access transistors of the 6-T SRAM cell that control access to the cross-coupled CFETS 50, 52 during read and write operations.

At this point in the process flow, the sacrificial gate structures 20 represent placeholder structures that are subsequently cut and replaced by functional gate structures in the process flow. The functional gate structures are used to control output current (i.e., flow of carriers in the channel) of the CFETS 50, 52 and NSFETs 54, 56.

Figure 9:
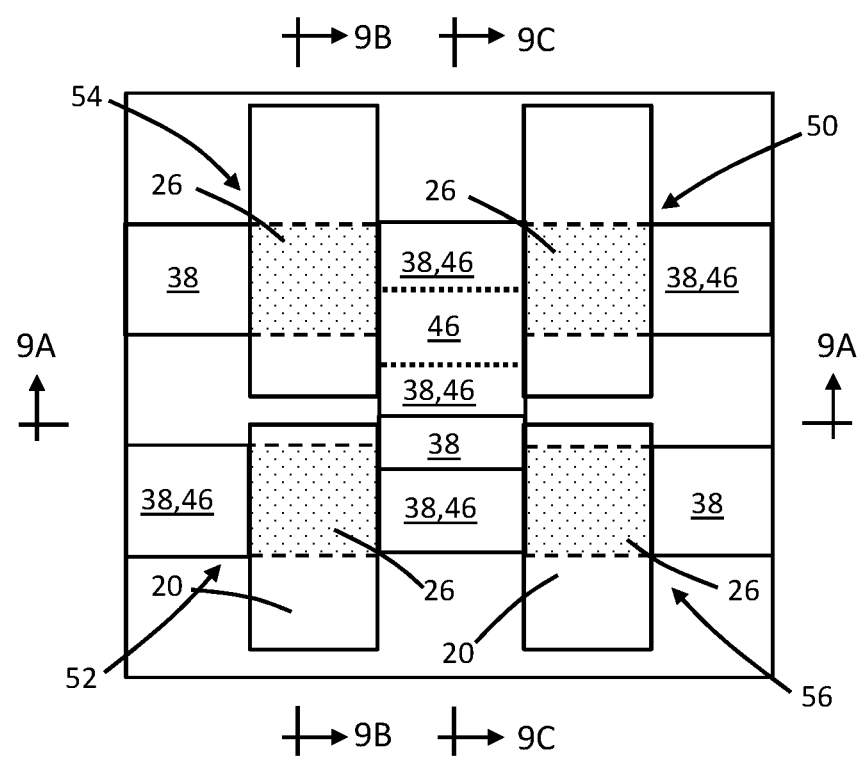
FIG. 9 is a top view similar to FIG. 8B of the device structure of FIGS. 8, 8A, 8B at a subsequent fabrication stage of the processing method, and in which only the sacrificial gate structures, body features, and source/drain regions are shown for clarity of description.
Figure 9A:
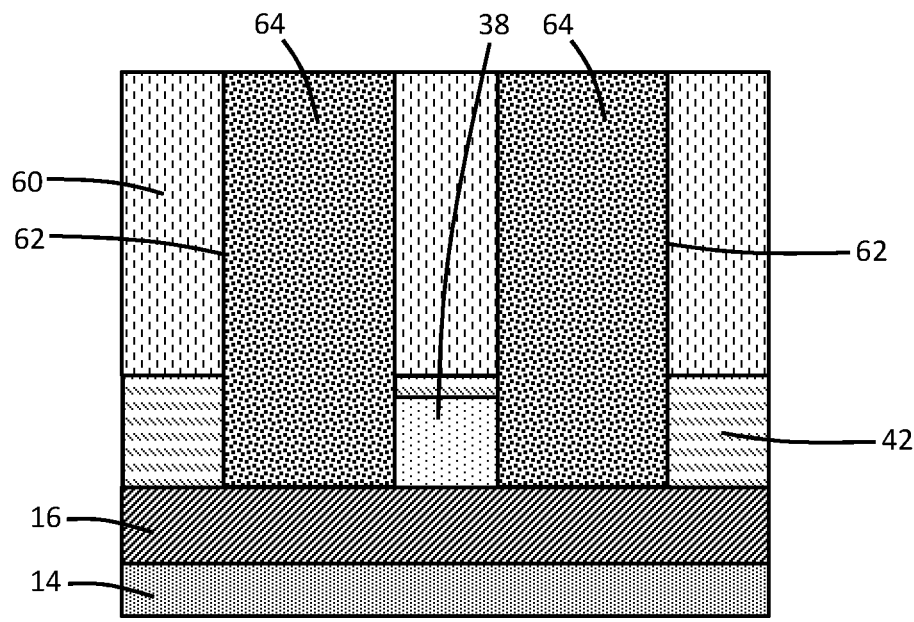
FIG. 9A is a cross-sectional view of the device structure taken generally along line 9A-9A in FIG. 9.
Figure 9B:
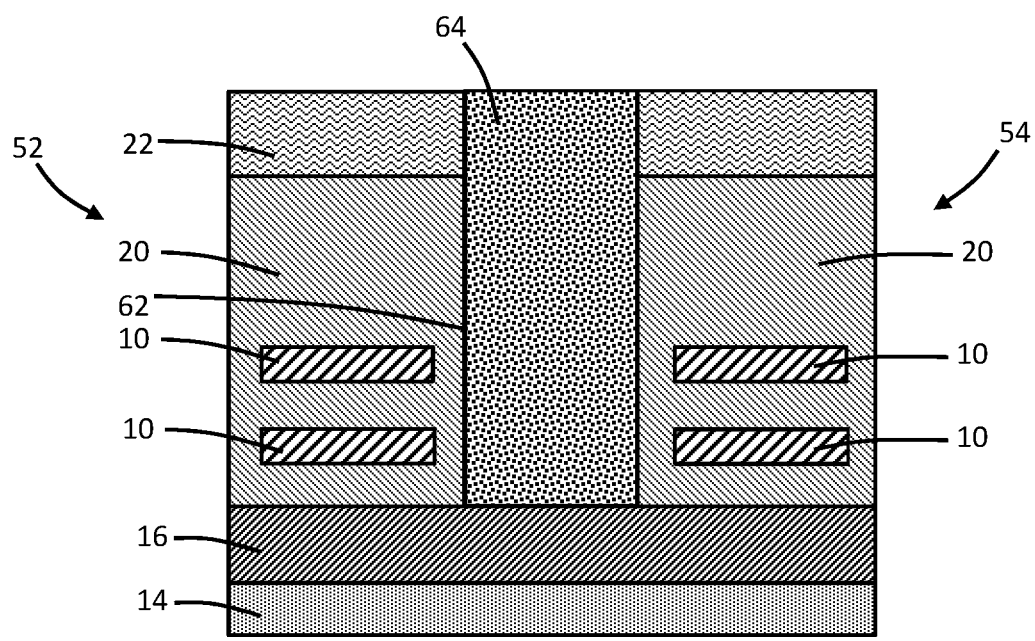
FIG. 9B is a cross-sectional view of the device structure taken generally along line 9B-9B in FIG. 9.
Figure 9C:
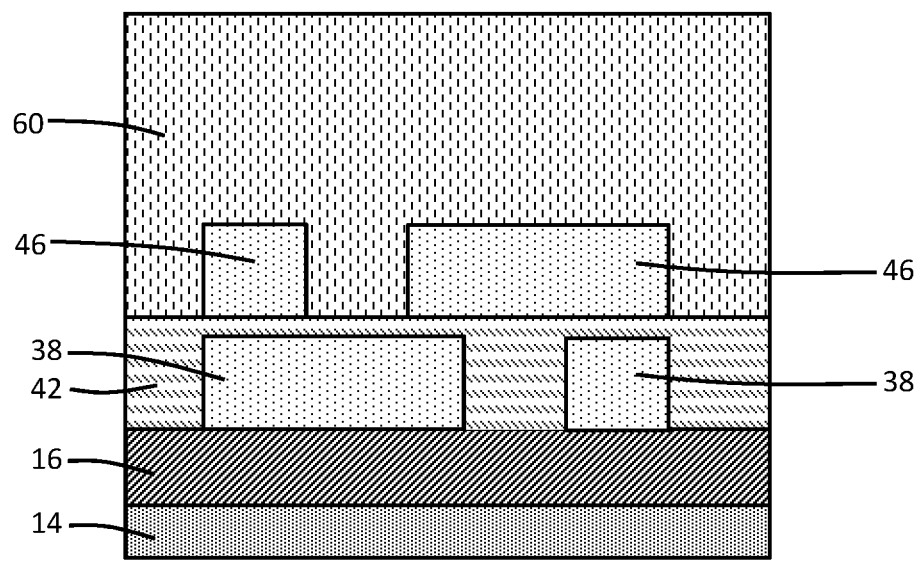
FIG. 9C is a cross-sectional view of the device structure taken generally along line 9C-9C in FIG. 9.

With reference to FIGS. 9, 9A, 9B, 9C in which like reference numerals refer to like features in FIGS. 8, 8A, 8B and at a subsequent fabrication stage of the processing method, the process flow continues with the gate replacement, and is best described in connection with a different set of views of the structure. In FIG. 9B, the overlap between the source/drain regions 38 and 46 of CFET 50 and the source/drain regions 38 and 46 of CFET 52 is visible. As apparent in FIG. 9B, the source/drain regions 38 of the CFETs 50 and 52 patterned from the semiconductor layer 36 are contained in a plane, and the source/drain regions 46 of the CFETs 50 and 52 patterned from the semiconductor layer 44 are contained in another plane that is displaced vertically from the plane containing the source/drain regions 38. In addition, the source/drain regions 38 may be dimensioned, when patterned, to have different physical sizes and, similarly, the source/drain regions 46 may be dimensioned, when patterned, to have different physical sizes.

The sacrificial gate structures 20 and their dielectric spacers 24 are patterned with lithography and etching to define cuts 62 in the sacrificial gate structures 20. The cuts 62 are filled by a dielectric layer 64 composed of a dielectric material, such as SiCO or SiC, selected to be removable with an etching process selective to the material of the dielectric layer 60. The sacrificial gate structures 20 remain intact on opposite sides of the cuts 62 to provide a separation between the cut ends of the now-sectioned sacrificial gate structures 20.

Figure 10A:
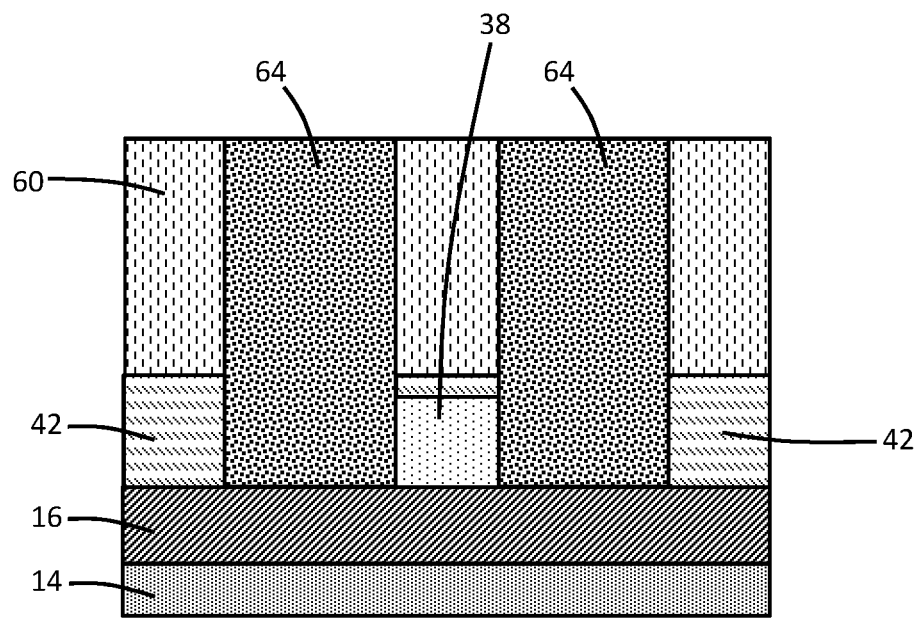
Figure 10B:
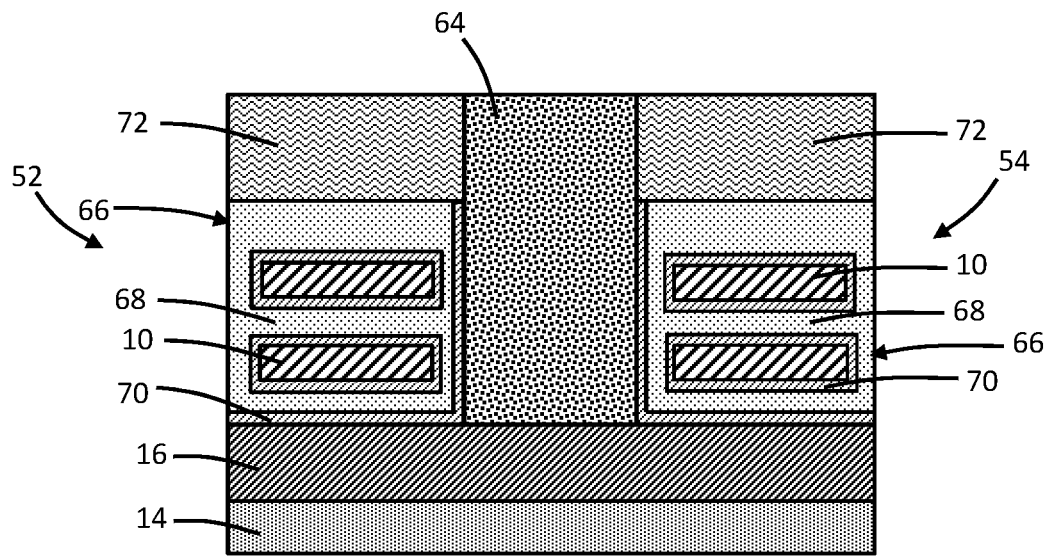
Figure 10C:
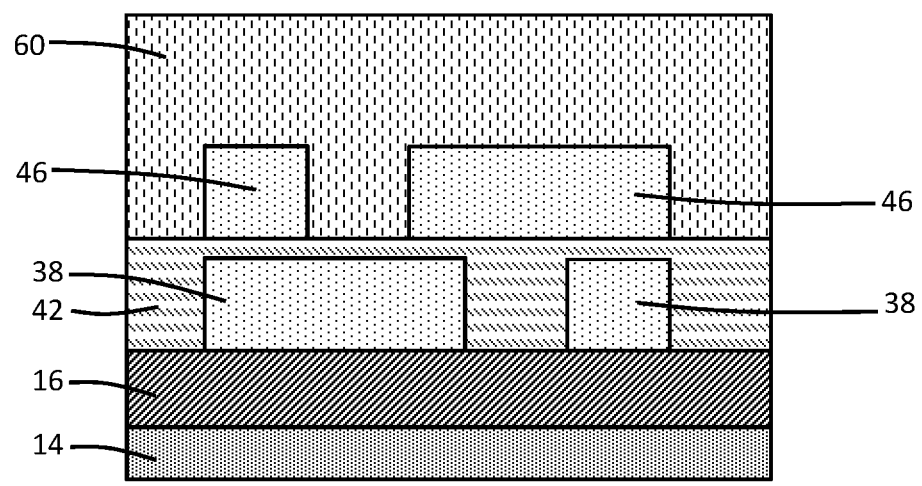

With reference to FIGS. 10A, 10B, 10C in which like reference numerals refer to like features in FIGS. 9, 9A, 9B, 9C and at a subsequent fabrication stage of the processing method, the dielectric layer 60, the dielectric layer 64 in the cuts 62, and the dielectric caps 22 are polished to expose the sacrificial gate structures 20. The sacrificial gate structures 20 and sacrificial layers 12 may be sequentially removed with one or more etching processes that remove their materials selective to the materials of the nanosheet channel layers 10 and the inner spacers 34, which releases the nanosheet channel layers 10.

After removing the sacrificial gate structures 20 to release the nanosheet channel layers 10, functional gate structures 66 associated with the CFETs 50, 52 and NSFETs 54, 56 are formed in the spaces surrounding each of the nanosheet channel layers 10 as part of a replacement gate process. The dielectric layer 64 in the cuts 62 is unaffected by the replacement gate process. Each functional gate structure 66 may include a gate dielectric layer 70 composed of a dielectric material, such as a high-k dielectric like hafnium oxide ($HfO_2$), and a metal gate electrode 68. The gate dielectric layer 70 is arranged between the metal gate electrode 68 and the exterior surfaces of the nanosheet channel layers 10, as well as between the metal gate electrode 68 and the dielectric layer 64 in the cuts 62. The metal gate electrode 68 includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). A cap 72 composed of a dielectric material, such as silicon nitride, is formed in the spaces over each of the functional gate structures 66.

Sections of the functional gate structure 66 are located in the spaces formerly occupied by the removed sacrificial layers 12. These sections of the functional gate structure surround respective exterior surfaces of the nanosheet channel layers 10 in a gate-all-around arrangement in which the sections of the functional gate structure 66 are wrapped about the individual nanosheet channel layers 10. The nanosheet channel layers 10 of the CFET 50 and nanosheet channel layers 10 of the CFET 52 are arranged in a vertical stack. The nanosheet channel layers 10 function as channels for carrier flow that are formed during operation of the CFETs 50, 52, as well as during the operation of the NSFETs 54, 56. The inner spacers 34 are arranged between the sections of the functional gate structure 66 and the source/drain regions 38, 46 composed of epitaxial semiconductor materials with different conductivity types.

Figure 11A:
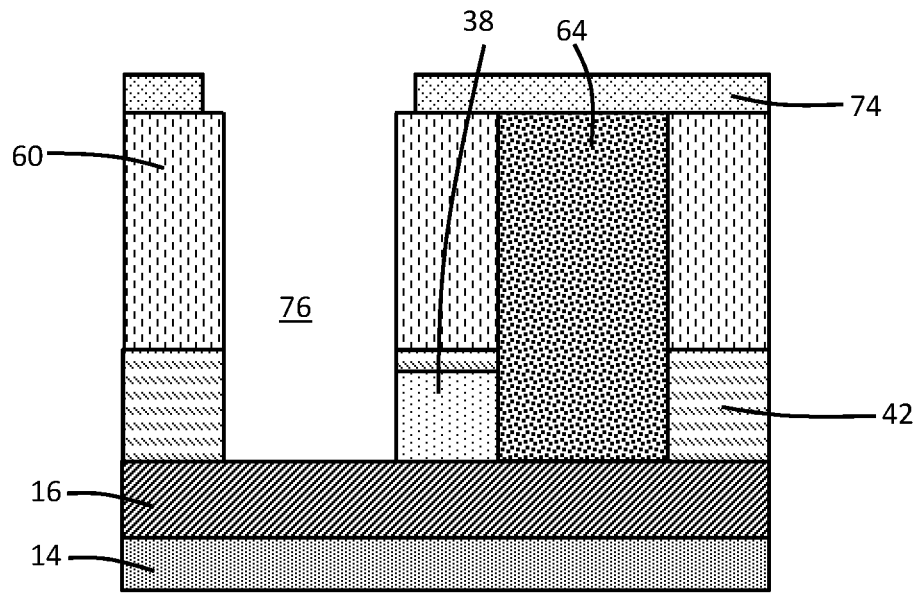
Figure 11B:
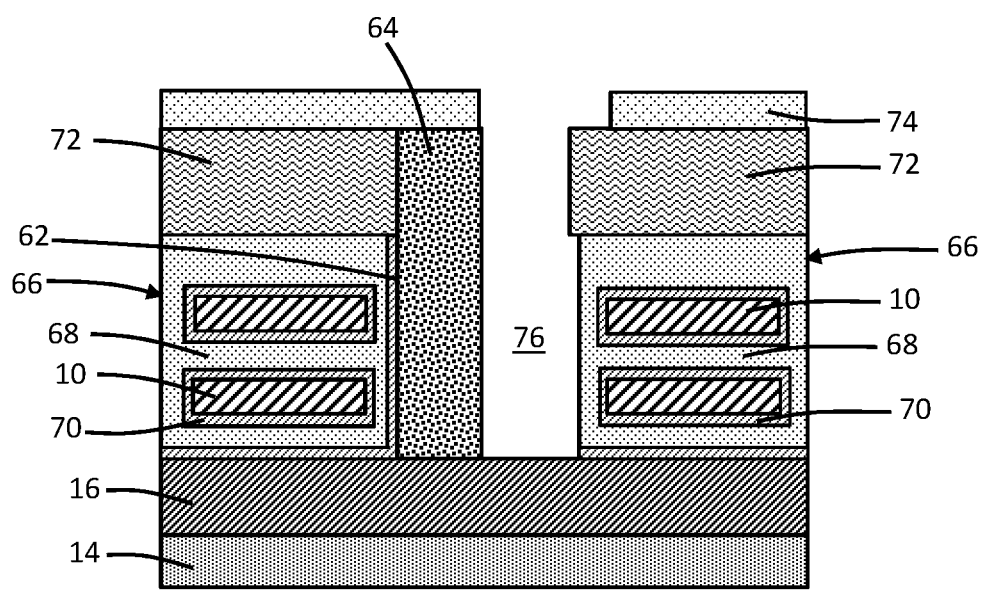
Figure 11C:
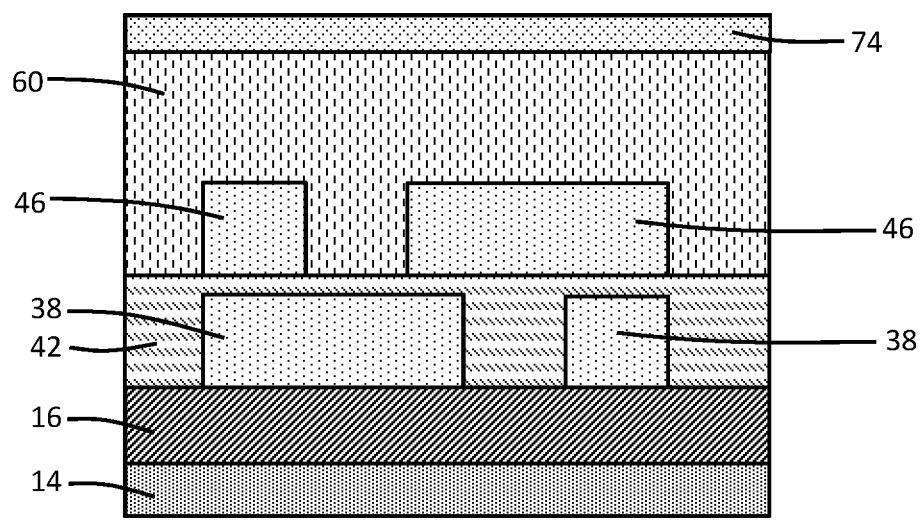

With reference to FIGS. 11A, 11B, 11C in which like reference numerals refer to like features in FIGS. 10A, 10B, 10C and at a subsequent fabrication stage of the processing method, an etch mask 74 is formed over the structure and patterned to form an opening 76 that is aligned with a portion of the dielectric layer 64 in one of the cuts 62. The etch mask 74 may include a spin-on hardmask (SOH), such as an organic planarization layer (OPL), that is applied by spin coating and patterned by lithography and etching. The exposed portion of the dielectric layer 64 is removed with an etching process, such as reactive ion etching (RIE), selective to the material of the dielectric layer 60. The opening 76 exposes a portion of one of the functional gate structures 66, and the gate dielectric layer 70 is removed from the metal gate electrode 68 of the exposed portion of the functional gate structure 66 by an etching process.

Figure 12A:
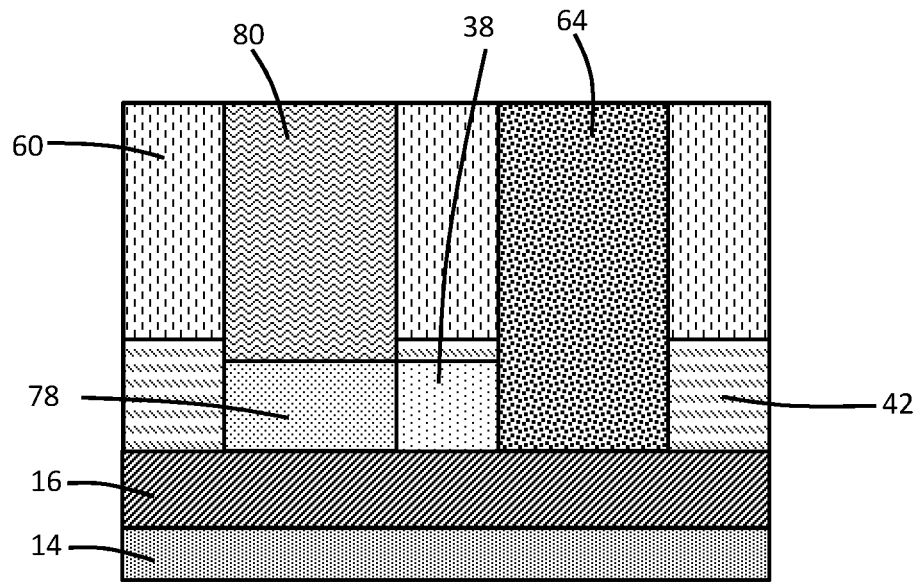
Figure 12B:
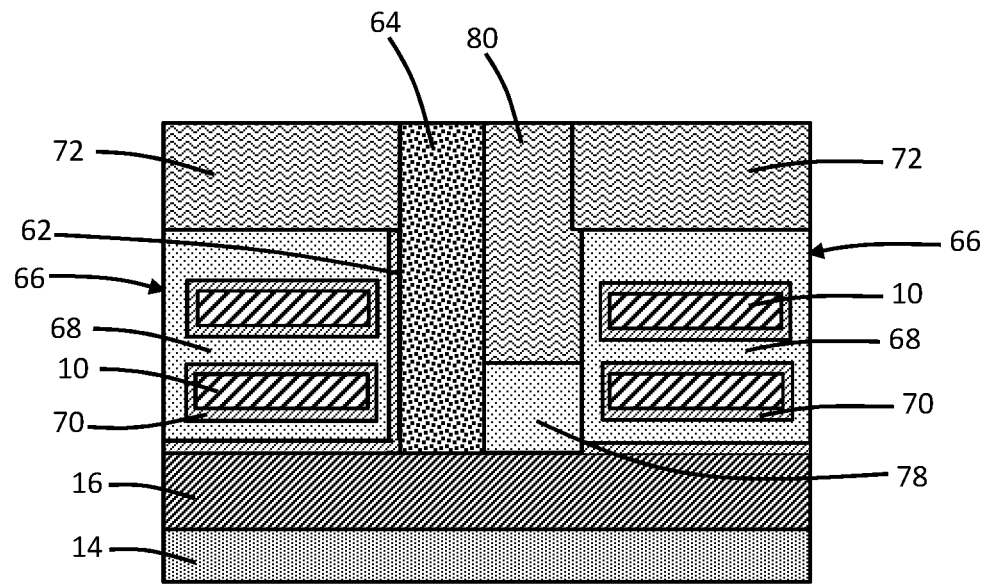
Figure 12C:
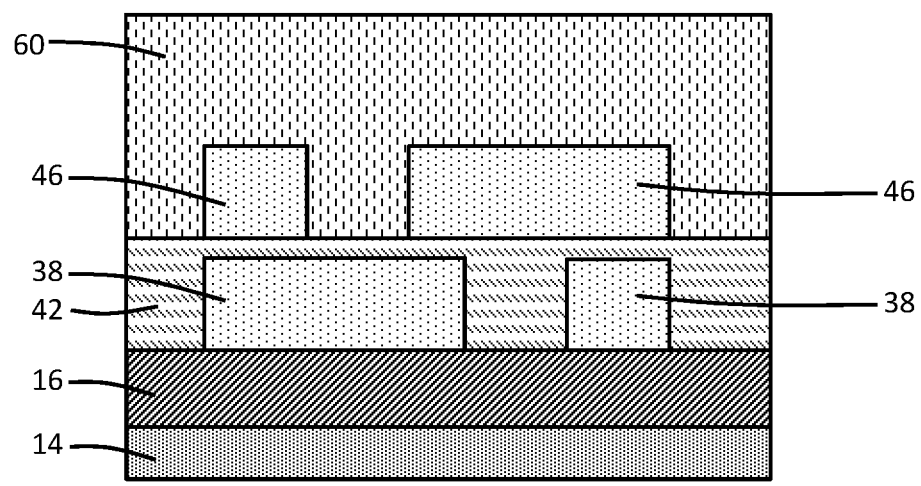

With reference to FIGS. 12A, 12B, 12C in which like reference numerals refer to like features in FIGS. 11A, 11B, 11C and at a subsequent fabrication stage of the processing method, a conductor layer 78 is deposited inside the opening 76. The conductor layer 78 provides a buried interconnect extending between the metal gate electrode 68 of the exposed portion of the functional gate structure 66 and one of the source/drain regions 38. In the representative embodiment, the buried interconnect provided by the conductor layer 78 cross-couples the functional gate structure 66 of CFET 52 with the source/drain region 38 of CFET 50. The larger dimensions of the coupled source/drain region 38 may contribute to providing the coupling between the functional gate structure 66 of CFET 52 and the source/drain region 38 of CFET 50. While not visible in the drawings, a buried interconnect (not shown) provided by a different section of the conductor layer 78 may cross-couple the functional gate structure 66 of the CFET 50 with the source/drain region 38 of the CFET 52. The conductor layer 78 may be composed of a metal, such as tungsten (W), cobalt (Co), or ruthenium (Ru), that is deposited and etch back. A cap 80, which may be comprised of silicon nitride, is formed in the space above the conductor layer 78, and cooperates with cap 72 to cover the functional gate structures 66.

Figure 13:
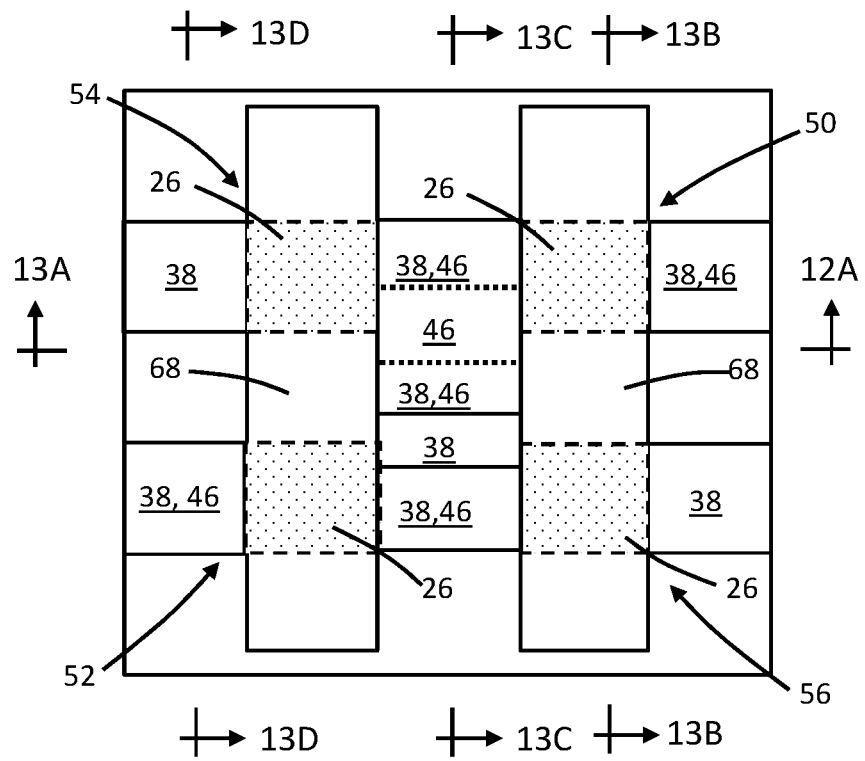
FIG. 13 is a top view similar to FIG. 8 of the device structure of FIGS. 12A, 12B, 12C at a subsequent fabrication stage of the processing method, and in which only the functional gate structures, body features, and source/drain regions are shown for clarity of description.
Figure 13A:
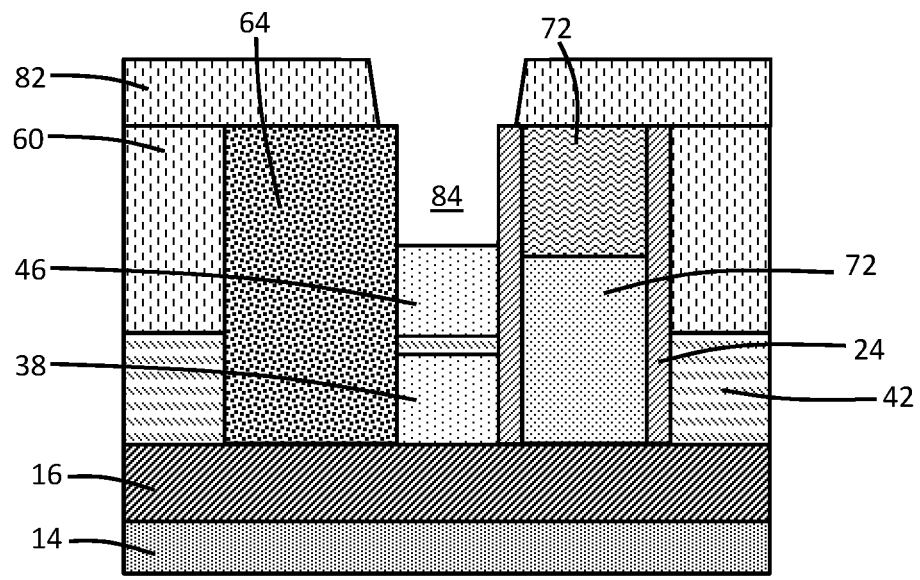
FIG. 13A is a cross-sectional view of the device structure taken generally along line 13A-13A in FIG. 13.
Figure 13B:
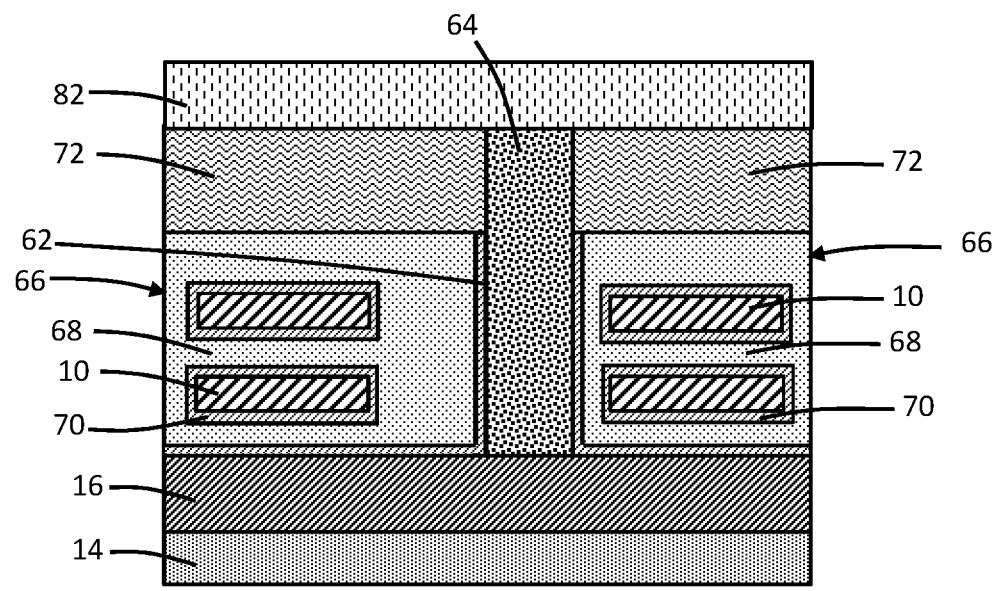
FIG. 13B is a cross-sectional view of the device structure taken generally along line 13B-13B in FIG. 13.
Figure 13C:
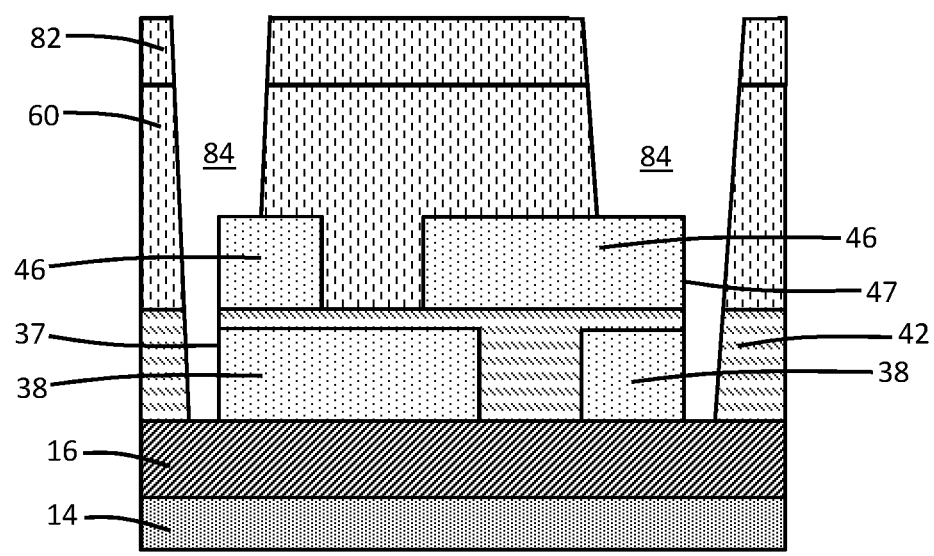
FIG. 13C is a cross-sectional view of the device structure taken generally along line 13C-13C in FIG. 13.
Figure 13D:
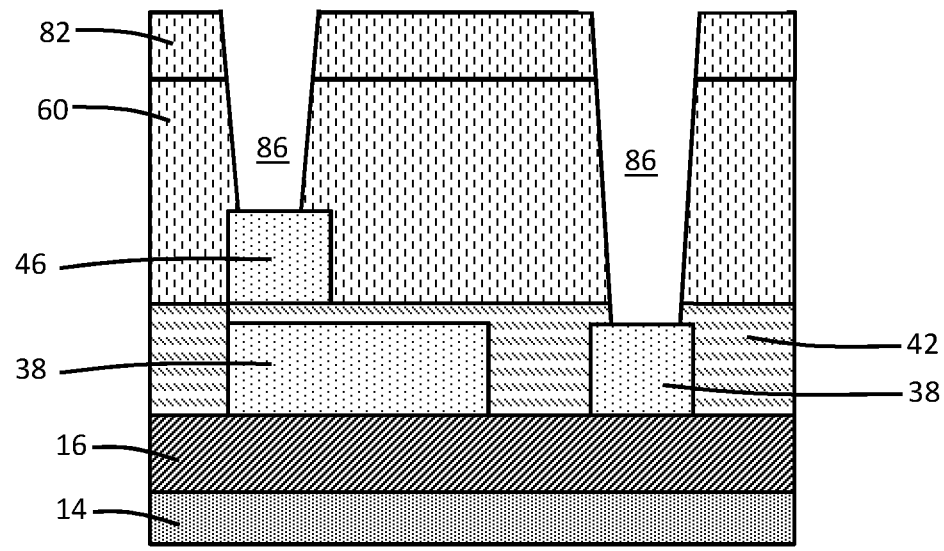
FIG. 13D is a cross-sectional view of the device structure taken generally along line 13D-13D in FIG. 13.

With reference to FIGS. 13, 13A, 13B, 13C, 13D in which like reference numerals refer to like features in FIGS. 12A, 12B, 12C and at a subsequent fabrication stage of the processing method, the process flow continues with the formation of contacts, and is best described in connection with a different set of views of the structure. FIG. 13A is taken generally along the same line as FIG. 8A, but after the cuts 62 are formed and filled by dielectric layer 64 and also following the replacement of the sacrificial gate structures 20 by the functional gate structures 64. FIG. 13C is taken generally along the same line as FIG. 12C.

A sacrificial dielectric layer 82 is deposited over the structure and patterned with reactive ion etching and an etch mask to provide openings 84, 86 extending to the upper source/drain regions 46 and the lower source/drain regions 38. The dielectric layers 60 and 82 may be patterned by an etching process that removes the dielectric layers 60 and 82 selective to the materials of the caps 72, 80, the dielectric spacers 24, the dielectric layer 64 in the cuts 62, and the source/drain regions 38 and 46. One of the openings 84 intersects and exposes the side edge 37 of source/drain region 38 of the CFET 50 and the side edge 47 of source/drain region 46 of the CFET 50. Another of the openings 84 intersects and exposes the side edge 37 of source/drain region 38 of the CFET 52 and the side edge 47 of source/drain region 46 of the CFET 52.

With reference to FIGS. 14A, 14B, 14C, 14D in which like reference numerals refer to like features in FIGS. 13A, 13B, 13C, 13D and at a subsequent fabrication stage of the processing method, trench silicide (TS) contacts 88, 90 are respectively formed in the openings 84, 86 and extend vertically to the upper source/drain regions 46 and the lower source/drain regions 38. The TS contacts 88, 90 may include a metal silicide, such as tungsten silicide ($WSi_2$), titanium silicide ($TiSi_2$), nickel silicide (NiSi), or cobalt silicide ($CoSi_2$), as well as an overlying conductor, such as tungsten (W) or cobalt (Co). The TS contacts 88, 90 may be planarized by chemical mechanical polishing (CMP) to the level of the caps 72, 80, which removes the sacrificial dielectric layer 82. One of the TS contacts 88 intersects the exposed side edge 37 of source/drain region 38 of the CFET 50 and the exposed side edge 47 of source/drain region 46 of the CFET 50. Another of the TS contacts 88 intersects the expose side edge 37 of source/drain region 38 of the CFET 52 and the exposed side edge 47 of source/drain region 46 of the CFET 52.

Figure 14A:
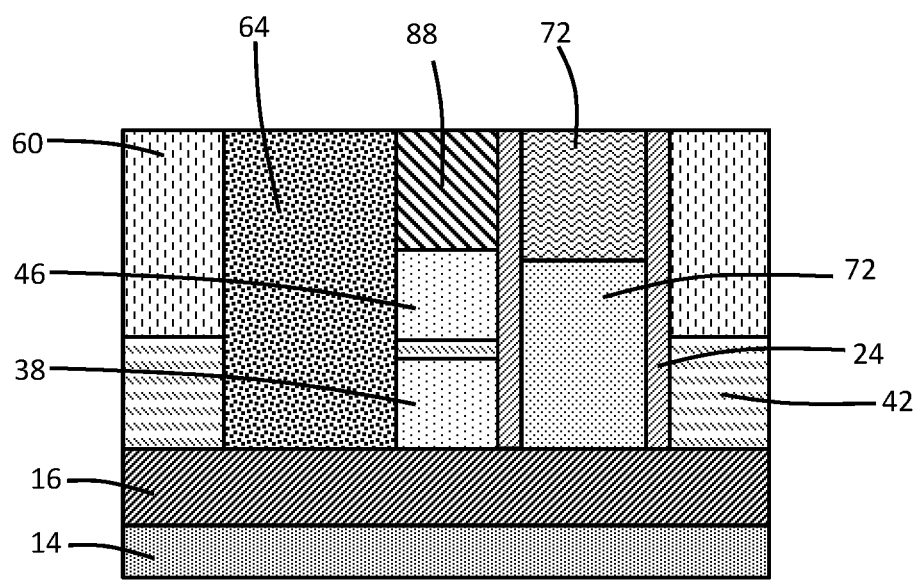
FIG. 14A is a cross-sectional view of the device structure of FIG. 13A at a subsequent fabrication stage.
Figure 14B:
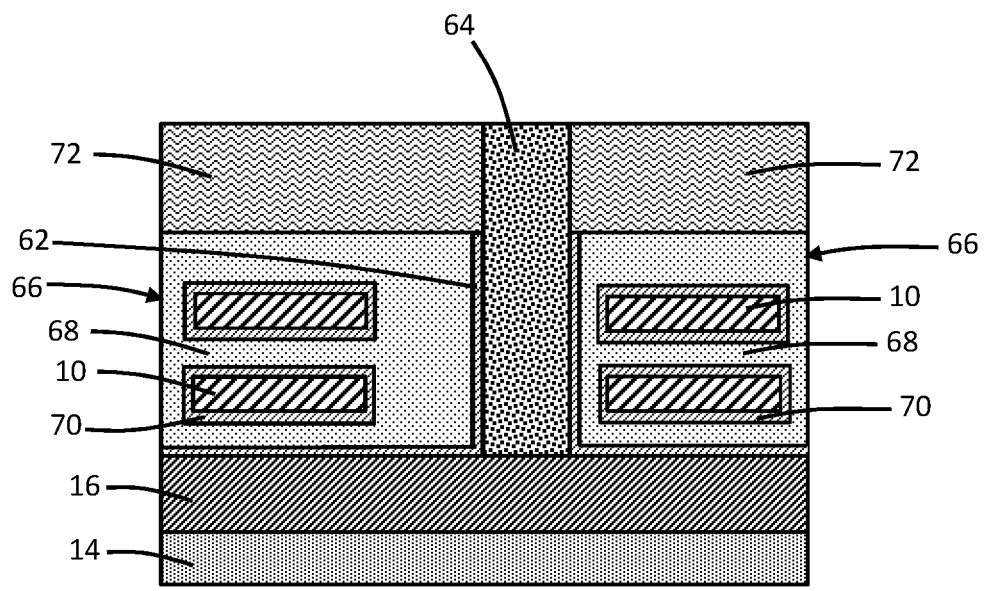
FIG. 14B is a cross-sectional view of the device structure of FIG. 13B at a subsequent fabrication stage.
Figure 14C:
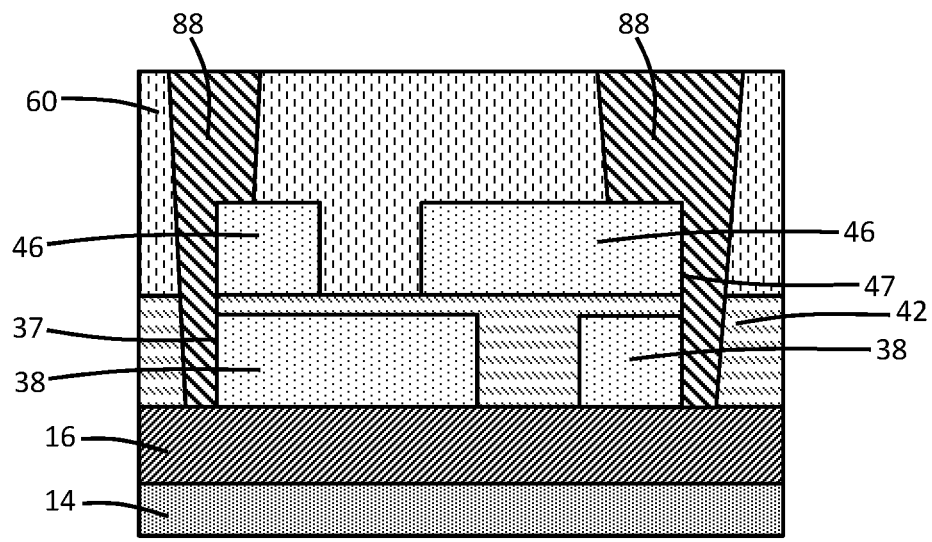
FIG. 14C is a cross-sectional view of the device structure of FIG. 13C at a subsequent fabrication stage.
Figure 14D:
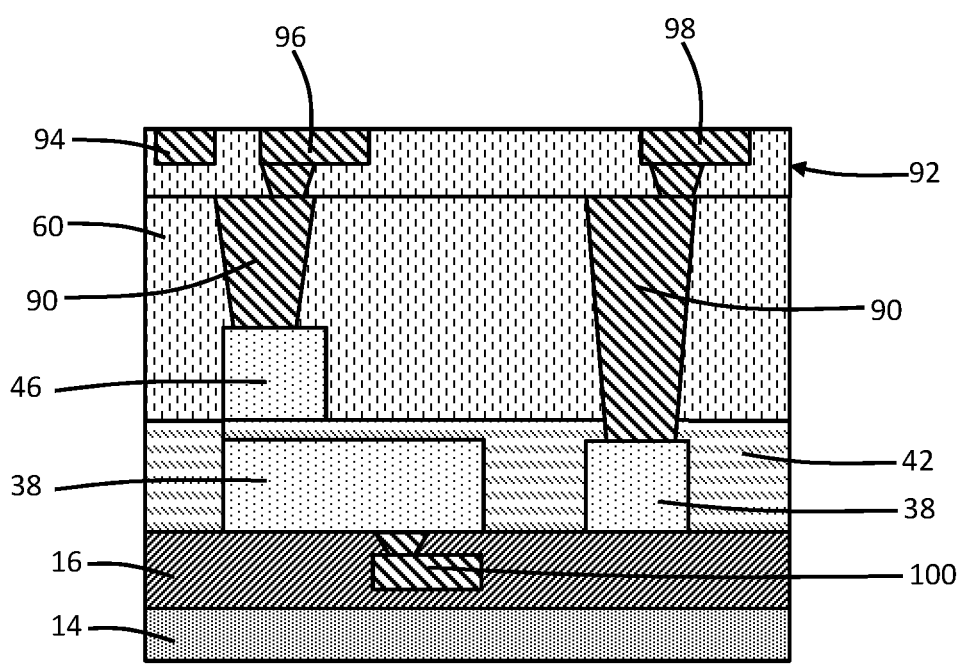
FIG. 14D is a cross-sectional view of the device structure of FIG. 13D at a subsequent fabrication stage.

As best shown in FIG. 14D, another metallization level 92 may be formed on the structure. The metallization level 92 includes a contact (not shown) coupled with the functional gate structures 66 and conductive features 94, 96, 98. Conductive feature 96 is connected with the source/drain region 46 of the CFET 52, and conductive feature 98 is connected with the source/drain region 38 of the CFET 54. In an embodiment, the conductive feature 94 may be a bitline connected with a 6-T SRAM cell that includes the CFETs 52, 54 and NSFETs 56, 58, the conductive feature 96 may be a positive supply voltage ($V_{DD}$) line connected with the source/drain region 46, and the conductive feature 98 may be an inverse bitline connected with the 6-T SRAM cell. A ground ($V_{SS}$) line (not shown) may also be formed in the metallization level 92 and coupled with the source/drain region 38. Alternatively, a conductive feature 100 that is provided in the dielectric layer 16 may be coupled with the source/drain region 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
   a trench isolation having a top surface;
   a first complementary field-effect transistor including a
      first nanosheet transistor with a source/drain region and
      a second nanosheet transistor having a source/drain region, the source/drain region of the second nanosheet transistor stacked over the source/drain region of the first nanosheet transistor;

a second complementary field-effect transistor including a first nanosheet transistor with a functional gate structure that is coupled with the source/drain region of the first nanosheet transistor of the first complementary field-effect transistor; and a contact extending vertically to connect the source/drain region of the first nanosheet transistor of the first complementary field-effect transistor and the source/drain region of the second nanosheet transistor of the first complementary field-effect transistor, wherein the functional gate structure of the first nanosheet transistor of the second complementary field-effect transistor and the source/drain region of the first nanosheet transistor of the first complementary field-effect transistor are arranged on the top surface of the trench isolation.

2. The structure of claim 1 further comprising:
a buried interconnect on the top surface of the trench isolation, the buried interconnect coupling the functional gate structure of the nanosheet transistor of the second complementary field-effect transistor with the source/drain region of the first nanosheet transistor of the first complementary field-effect transistor.

3. The structure of claim 2 further comprising:
a dielectric layer arranged between the source/drain region of the first nanosheet transistor of the first complementary field-effect transistor and the source/drain region of the second nanosheet transistor of the first complementary field-effect transistor, wherein the buried interconnect is arranged between the top surface of the trench isolation and the dielectric layer.

4. The structure of claim 1 further comprising:
a buried interconnect beneath the top surface of the trench isolation, wherein the source/drain region of the first nanosheet transistor of the first complementary field-effect transistor is arranged on the top surface of the trench isolation, and the buried interconnect is coupled with the source/drain region of the first nanosheet transistor of the first complementary field-effect transistor.

5. The structure of claim 4 wherein the buried interconnect couples a positive supply voltage line or a ground line with the source/drain region of the first nanosheet transistor of the first complementary field-effect transistor.

6. The structure of claim 1 wherein the source/drain region of the first nanosheet transistor of the first complementary field-effect transistor has a first side edge, the source/drain region of the second nanosheet transistor of the first complementary field-effect transistor has a second side edge, and the contact is connected with the first side edge and the second side edge.

7. The structure of claim 1 further comprising:
an access nanosheet transistor having a first source/drain region and a first nanosheet channel layer coupling the first source/drain region of the access nanosheet transistor with the source/drain region of the first nanosheet transistor of the first complementary field-effect transistor.

8. The structure of claim 7 further comprising:
a dielectric layer arranged between the source/drain region of the first nanosheet transistor of the first complementary field-effect transistor and the source/drain region of the second nanosheet transistor of the first complementary field-effect transistor, wherein the first nanosheet channel layer and the first source/drain region of the access nanosheet transistor are arranged below the dielectric layer, the access nanosheet transistor includes a second nanosheet channel layer that is arranged above the dielectric layer, and the access nanosheet transistor lacks a second source/drain region above the dielectric layer.

9. A structure comprising:
a trench isolation having a top surface;
a first complementary field-effect transistor including a first nanosheet transistor with a source/drain region, and a second nanosheet transistor having a source/drain region, the source/drain region of the second nanosheet transistor stacked over the source/drain region of the first nanosheet transistor; and a second complementary field-effect transistor including a first nanosheet transistor with a functional gate structure that is coupled with the source/drain region of the first nanosheet transistor of the first complementary field-effect transistor, wherein the functional gate structure of the nanosheet transistor of the second complementary field-effect transistor and the source/drain region of the first nanosheet transistor of the first complementary field-effect transistor are arranged on the top surface of the trench isolation.

10. The structure of claim 9 further comprising:
a buried interconnect on the top surface of the trench isolation, the buried interconnect coupling the functional gate structure of the nanosheet transistor of the second complementary field-effect transistor with the source/drain region of the first nanosheet transistor of the first complementary field-effect transistor.

11. The structure of claim 10 further comprising:
a dielectric layer arranged between the source/drain region of the first nanosheet transistor of the first complementary field-effect transistor and the source/drain region of the second nanosheet transistor of the first complementary field-effect transistor, wherein the buried interconnect is arranged between the top surface of the trench isolation and the dielectric layer.

12. The structure of claim 9 wherein the first complementary field-effect transistor includes a functional gate structure, and the first nanosheet transistor of the second complementary field-effect transistor includes a source/drain region that is coupled with the functional gate structure of the first complementary field-effect transistor.

13. The structure of claim 12 wherein the second complementary field-effect transistor includes a second nanosheet transistor having a source/drain region, and the source/drain region of the second nanosheet transistor of the second complementary field-effect transistor is stacked over the source/drain region of the first nanosheet transistor of the second complementary field-effect transistor.

14. The structure of claim 9 further comprising:
a dielectric layer arranged between the source/drain region of the first nanosheet transistor of the first complementary field-effect transistor and the source/drain region of the second nanosheet transistor of the first complementary field-effect transistor.

15. The structure of claim 9 further comprising:
a first access nanosheet transistor having a source/drain region and a nanosheet channel layer coupling the source/drain region of the access nanosheet transistor with the source/drain region of the first nanosheet transistor of the first complementary field-effect transistor.

16. The structure of claim 15 wherein the first complementary field-effect transistor includes a functional gate structure, and the first nanosheet transistor of the second complementary field-effect transistor includes a source/drain region that is coupled with the functional gate structure of the first complementary field-effect transistor, and further comprising:
a second access nanosheet transistor having a source/drain region and a nanosheet channel layer coupling the source/drain region of the second access nanosheet transistor with the source/drain region of the first nanosheet transistor of the second complementary field-effect transistor.

17. A method comprising:
forming a trench isolation having a top surface;
forming a first complementary field-effect transistor including a first nanosheet transistor with a source/drain region and a second nanosheet transistor having a source/drain region, wherein the source/drain region of the second nanosheet transistor is stacked over the source/drain region of the first nanosheet transistor;
forming a second complementary field-effect transistor including a nanosheet transistor with a functional gate structure that is coupled with the source/drain region of the first nanosheet transistor of the first complementary field-effect transistor; and
forming a contact extending vertically to connect the source/drain region of the first nanosheet transistor of the first complementary field-effect transistor and the source/drain region of the second nanosheet transistor of the first complementary field-effect transistor
wherein the functional gate structure of the nanosheet transistor of the second complementary field-effect transistor and the source/drain region of the first nanosheet transistor of the first complementary field-effect transistor are arranged on the top surface of the trench isolation.

18. The method of claim 17 wherein the source/drain region of the first nanosheet transistor of the first complementary field-effect transistor has a first side edge, the source/drain region of the second nanosheet transistor of the first complementary field-effect transistor has a second side edge, and the contact is connected with the first side edge and the second side edge.

19. The method of claim 17 further comprising:
forming a buried interconnect on the top surface of the trench isolation,
wherein the buried interconnect couples the functional gate structure of the nanosheet transistor of the second complementary field-effect transistor with the source/drain region of the first nanosheet transistor of the first complementary field-effect transistor.

20. The method of claim 19 further comprising:
forming a dielectric layer that is arranged between the source/drain region of the first nanosheet transistor of the first complementary field-effect transistor and the source/drain region of the second nanosheet transistor of the first complementary field-effect transistor,
wherein the buried interconnect is arranged between the top surface of the trench isolation and the dielectric layer.

* * * * *